US005291123A

United States Patent [19]

Brown

[11] Patent Number: 5,291,123

[45] Date of Patent: Mar. 1, 1994

[54] PRECISION REFERENCE CURRENT GENERATOR

[75] Inventor: Charles A. Brown, Corvallis, Oreg.

[73] Assignee: Hewlett-Packard Company, Palo Alto, Calif.

[21] Appl. No.: 944,852

[22] Filed: Sep. 9, 1992

[51] Int. Cl.[5] .......... H03H 11/00

[52] U.S. Cl. .......... 323/369; 323/312

[58] Field of Search .......... 323/312, 364, 367, 369

[56] References Cited

U.S. PATENT DOCUMENTS

| | | | |
|---|---|---|---|
| 4,150,309 | 4/1979 | Tokuda | 307/310 |
| 4,349,777 | 9/1982 | Mitamura | 323/226 |
| 4,628,247 | 12/1986 | Rossetti | 323/314 |
| 4,808,907 | 2/1989 | Main | 323/316 |
| 4,833,344 | 5/1989 | Moon | 307/296.6 |
| 4,893,030 | 1/1990 | Shearer et al. | 307/296 |
| 4,970,415 | 11/1990 | Fitzpatrick et al. | 307/448 |
| 5,017,858 | 5/1991 | Hayashi | 323/316 |
| 5,099,139 | 3/1992 | Nishimura | 307/261 |
| 5,107,199 | 4/1992 | Vo et al. | 323/316 |
| 5,124,632 | 6/1992 | Greaves | 323/316 |
| 5,155,429 | 10/1992 | Nakao et al. | 323/315 |

*Primary Examiner*—J. L. Sterrett

[57] ABSTRACT

An integrated current generator circuit operates in conjunction with a known reference voltage and internal and external reference resistances. The current generator circuit includes three operational modes. In the first operational mode, the reference voltage is impressed upon the internal reference resistance to generate one or more relatively inaccurate output currents. In a second operational mode, the reference voltage is impressed upon an external reference resistance to generate one or more highly accurate output currents, even if an internal ESD resistor is used, or if the bonding pad has high series parasitic resistance. An alternative voltage sensing path is included to ensure the accuracy of the reference current. In a third operational mode, the reference voltage is again impressed upon the internal resistance, with the corresponding node voltage being connected to an external integrated circuit bonding pad.

7 Claims, 4 Drawing Sheets

PRECISION REFERENCE CURRENT GENERATOR

BACKGROUND OF THE INVENTION

The present invention relates to a method and apparatus for generating one or more reference currents, and, more particularly, to an integrated reference current generator that operates in conjunction with an external reference resistor. This application is related to my co-pending application entitled "LIGHT-EMITTING DIODE ARRAY CURRENT POWER SUPPLY INCLUDING SWITCHED CASCADE TRANSISTORS", Ser. No. 07/948,274.

Reference current generators are frequently used in integrated circuits for generating a multiplicity of bias currents that track with temperature, process variations, and transistor gain. Three embodiments of known reference circuits are shown in FIGS. 1-3, although other embodiments are known. Referring now to FIG. 1, reference circuit 10 includes an operational amplifier ("op-amp") 14, and multiple N-channel field-effect transistors ("FETs") 16–20 for generating multiple sink bias currents at the drains of each respective FET. Due to the feedback from node 22 at the drain of FET 16 to the non-inverting input of op-amp 14 and high loop gain, op-amp 14 imposes a voltage at the output node 26 such that the voltage at the inverting and non-inverting terminals is approximately equal. Since op-amp 14 has its inverting input connected to a reference voltage designated "$V_{REF}$", the voltage at its non-inverting input is also equal to $V_{REF}$. A reference resistance $R_{REF}$ is coupled to the non-inverting input of op-amp 14 and therefore a current, designated "$I_{REF}$" is generated with a magnitude equal to $(V_{CC}-V_{REF})/R_{REF}$. The reference resistance block 80 can be either a simple internal integrated resistance, such as a polysilicon or thin-film resistor, or a precision external resistance coupled to the circuit 10 through an external bonding pad 12. The gate-to-source voltage of FET 16 is impressed across the gate and source of output transistors 18 and 20, producing a current through each substantially similar to the reference current, assuming equally sized devices.

Another embodiment 40 of a reference current generator circuit is shown in FIG. 2. In FIG. 2, reference circuit 40 includes P-channel output FETs 28–32 to provide a multiplicity of source output bias currents. The output of op-amp 14 drives the gates of FETs 28, 30, and 32. In addition, the sources of FETs 28–32 are coupled together and to a source of positive supply voltage, VCC. As in reference circuit 10, the reference voltage $V_{REF}$ is coupled to the inverting input of op-amp 14. The drain of FET 28 is coupled to the non-inverting input of op-amp 14 because of the inverted gain from the gate to the drain of FET 28. The non-inverting input of op-amp 14 is also coupled to the reference resistance $R_{REF}$ through bonding pad 12. The op-amp 14 impresses the reference voltage $V_{REF}$ across reference resistance $R_{REF}$, which produces a reference current $I_{REF}$ equal to $V_{REF}/R_{REF}$. The gate-to-source voltage of FET 28 is impressed across the gate and source of output transistors 30 and 32. Circuit 40, and other similar circuits, are commonly used as LED drivers because each output driver is independent from the other. If one of the bias currents is interrupted or made inaccurate, it has no effect on the other bias currents.

Note that in reference circuits 10 and 40 reference current $I_{REF}$ flows directly through output transistors 16 and 28. The drain currents of transistor 16 and 28 cannot be used directly but are used to generate the reference gate-to-source voltage. If output transistor sizes are equal, output bias currents $I_{18}$–$I_{20}$ and $I_{30}$–$I_{32}$ are both substantially equal to $I_{REF}$. If output transistor sizes are unequal, output currents are proportional to the respective W/L ratios of the output transistors.

A third embodiment 50 of a typical reference circuit is shown in FIG. 3. Reference circuit 50 includes a single N-channel FET 16, the drain current of which is used to create a reference gate-to-source voltage through P channel FET 34. In circuit 50, op-amp 14 drives the gate of N-channel FET 16, with the non-inverting input connected to $V_{REF}$. The inverting input is coupled to the source of FET 16, which is coupled to the reference resistance $R_{REF}$. The generated reference current $I_{REF}$ is equal to $V_{REF}/R_{REF}$ and flows through N-channel FET 16 and P-channel current reference FET 34. The drain of FET 16 is connected to the coupled drain and gate of P-channel current reference FET 34, to generate a reference gate-to-source voltage between node 78 and VCC. The gates of output FETs 30 and 32 are coupled to node 78 to replicate the reference current. Circuit 50 is similar to circuit 40 except for the exact manner in which the reference gate-to-source voltage is generated.

In reference circuits 10, 40, and 50, as well as many other such circuits, a reference voltage, $V_{REF}$, and a reference impedance, $R_{REF}$, are known. The desired current output or outputs are one or more copies of a reference current equal or proportional to $I_{REF}$. The ability to accurately control the two known quantities directly determines the accuracy of the resulting desired output reference current $I_{REF}$. However, practical limitations in the fabrication and implementation of the reference circuit can have an adverse affect on accuracy of one or both of these quantities. FIG. 4 shows a simplified circuit 40 in which an external precision reference resistance is used. In many integrated circuits, it is desirable to protect output pins with an internal series electrostatic discharge ("ESD") protection resistor, $R_{ESD}$. In addition to the ESD protection resistor, a parasitic resistance $R_s$ exists as well. The parasitic and ESD protection resistor $R_s$ are both in series with the external reference resistor and are sources of reference current error. The value of the reference current is therefore modified according to the equation $V_{REF}/(R_{REF}+R_{ESD}+R_S)$. The output reference current is therefore not equal to the nominal design current of $V_{REF}/R_{REF}$. In addition, since the internal resistance $R_{ESD}$ and $R_s$ can vary widely with process variations and temperature, the corresponding reference current and generated output bias currents can also vary.

Another limitation of circuits 10, 40, and 50 is that they have one operational mode—either a relatively inaccurate internal reference mode or a relatively accurate external resistance mode. However, due to the practical limitations of producing integrated circuit resistances, it is desirable to provide for both an internal and external mode, especially if the internal resistance falls outside a predetermined acceptable resistance tolerance. In addition, a third mode is desired that allows the user to determine whether the internal inaccurate mode falls within the acceptable range of resistances.

It is desirable, therefore, to provide a current generator reference circuit in which undesirable variations in output current due to internal series resistance is minimized. Furthermore, it is also desirable to provide a reference circuit having two or more operational modes for use with the external or internal reference resistor, or for test and measurement purposes.

SUMMARY OF THE INVENTION

It is therefore an object of the invention to provide a reference current generator having a highly accurate output current when used in conjunction with an external reference resistance.

It is another object of the invention to provide a reference current generator having a plurality of operational and test modes.

It is an advantage of the present invention that reference circuit can easily be fabricated on an integrated circuit.

According to the present invention, a method and apparatus for providing an accurate reference current are disclosed. In the preferred embodiment, an integrated current generator circuit operates in conjunction with a known reference voltage and internal and external reference resistances. The current generator circuit includes three operational modes. In the first operational mode, the reference voltage is impressed upon the internal reference resistance to generate one or more relatively inaccurate output currents. In a second operational mode, the reference voltage is impressed upon an external reference resistance to generate one or more highly accurate output currents, even if an internal ESD resistor is used, or if high series parasitic resistance exists. An alternative voltage sensing path is included to ensure the accuracy of the reference current. In a third operational mode, the reference voltage is again impressed upon the internal resistance, with the corresponding node voltage being connected to an external integrated circuit bonding pad.

The foregoing and other objects, features and advantages of the invention will become more readily apparent from the following detailed description of a preferred embodiment of the invention which proceeds with reference to the accompanying drawings.

DETAILED DESCRIPTION OF THE INVENTION

Figure 1:
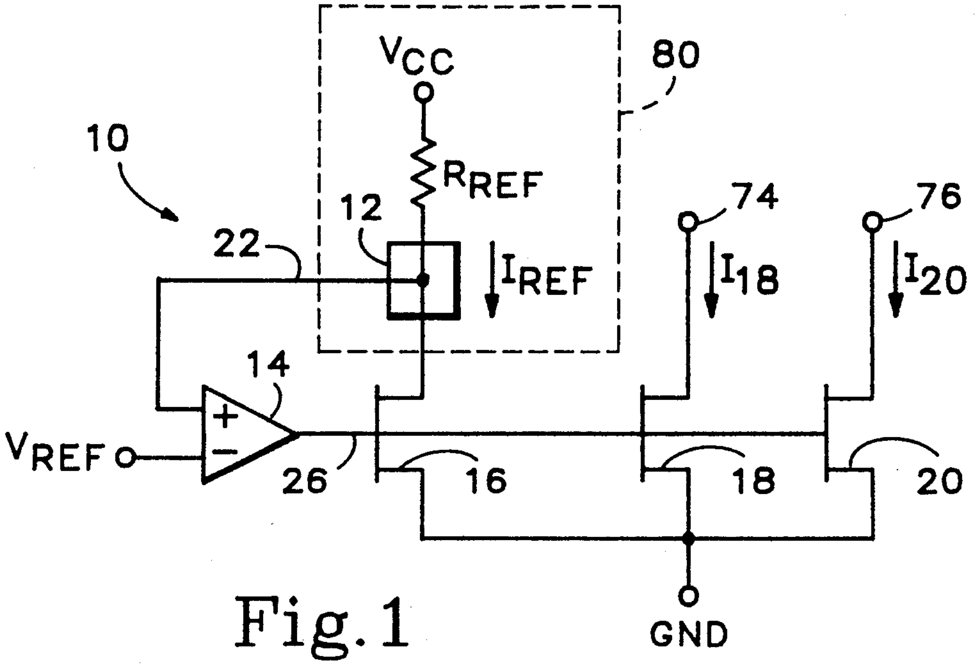
FIGS. 1-3 are schematic diagrams of prior art reference current generator circuits.
Figure 2:
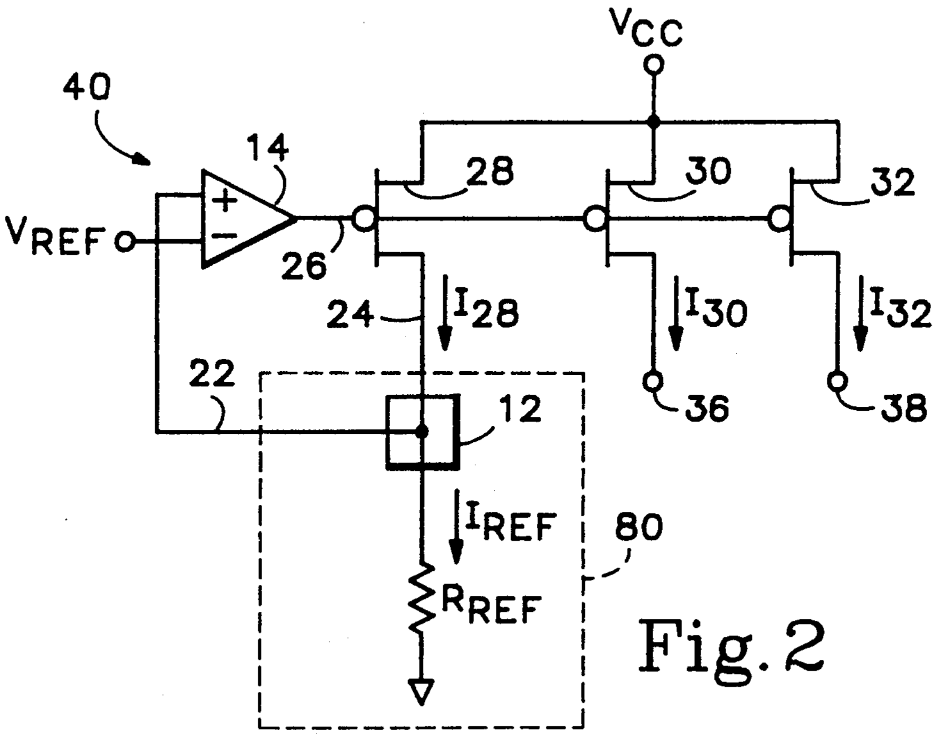
Figure 3:
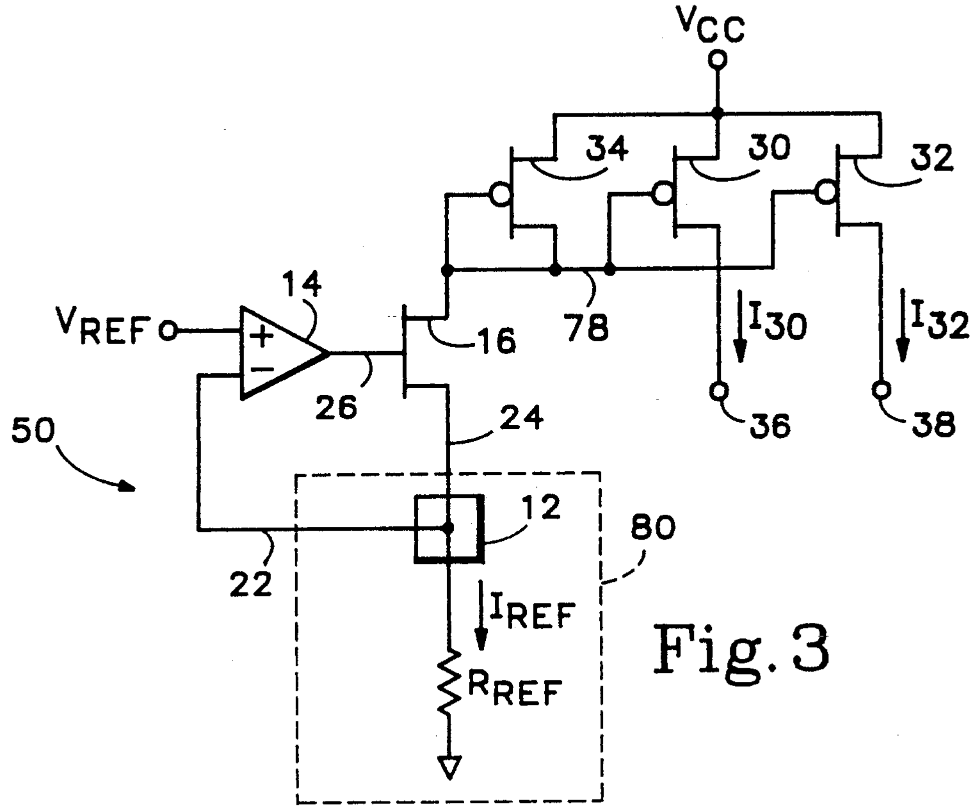
Figure 4:
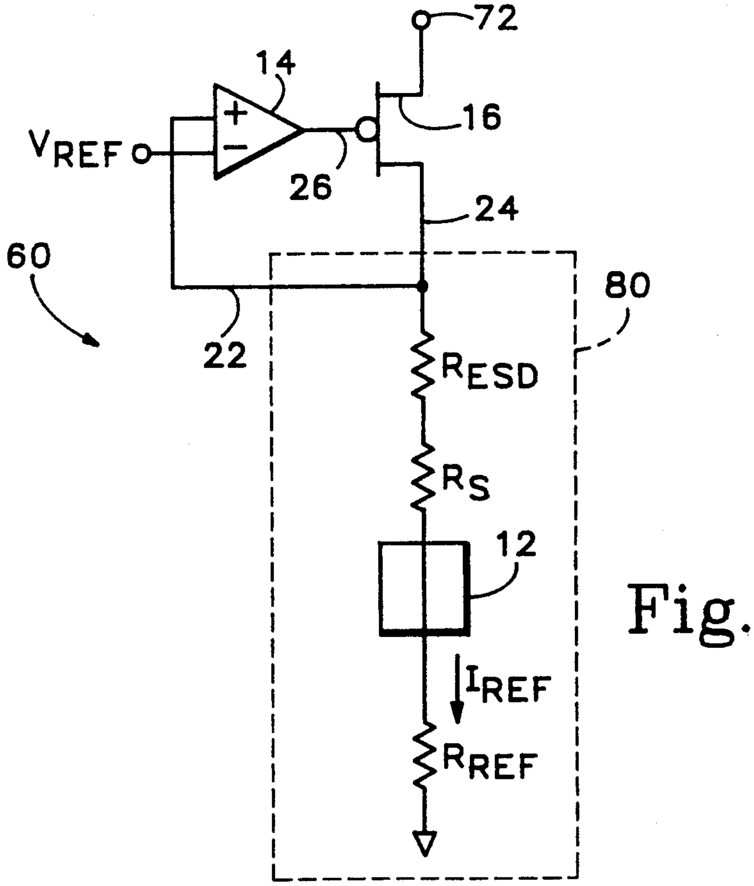
FIG. 4 is a schematic diagram of a simplified current generator circuit showing series resistance elements that create output current error.
Figure 5:
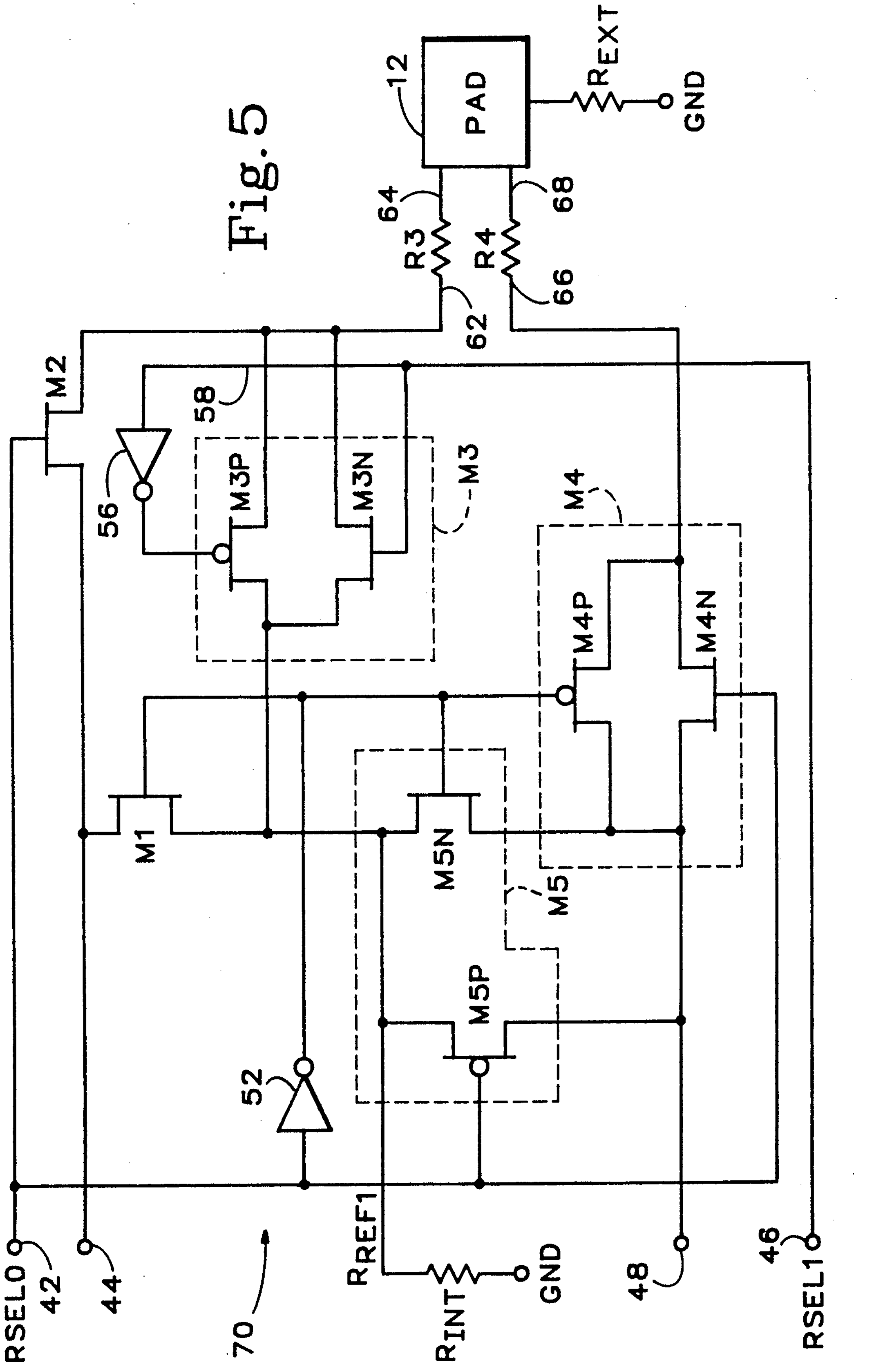
FIG. 5 is a schematic diagram of a reference generator circuit according to the present invention.

Referring now to FIG. 5, a reference resistance block 70 is shown, which generally corresponds to and replaces reference resistance block 80 shown in FIGS. 1-4. Reference block 70 is designed to work with any of the generator circuits shown in FIGS. 1-4, or any other MOS or bipolar reference generator circuit using a known voltage and reference resistance to create a reference current. In addition, the circuit can be modified, by changing N-channel FETs M1 and M2 to P-channel FETs, if so desired. Circuit 70 includes FET switches M1-M5, inverters 52 and 56, internal reference resistor $R_{INT}$, and first and second current paths R3 and R4. The interconnectivity and functional relationships of the circuit elements are discussed in further detail below.

The reference resistance block 70 has several I/O nodes that provide control, stimulus, or status to and from the block. Node 42 is an input for receiving a digital control signal labeled "RSELO". The reference current input node 44 receives the reference current $I_{REF}$ and corresponds to the current input node 24 shown in FIGS. 1-4. The reference current passes through node 44 which is then directed to the selected resistance, as is described in further detail below. Node 46 is an input for receiving a digital control signal labeled "RSEL1". Reference voltage sensing node 48 corresponds to the voltage sensing node 22 shown in FIGS. 1-4. The voltage level generated by the selected reference resistance is sensed at node 48. The integrated circuit bonding pad 12 provides a connection to the external precision resistance $R_{EXT}$, which corresponds to bonding pad 12 shown in FIGS. 1-4.

Several resistances, $R_{INT}$, $R_{EXT}$, R3 and R4, are used in reference resistance block 70. The precision external reference $R_{EXT}$ can be any commercially available precision resistor. The precision of resistor $R_{EXT}$ is selected according to the precision desired in the reference current $I_{REF}$. The value of $R_{EXT}$ is nominally set to 800 ohms, but can be any value in accordance with the desired application. A separate internal resistance $R_{INT}$ is fabricated on the integrated circuit. In the preferred embodiment, $R_{INT}$ is polysilicon, although other materials, such as diffused resistors or nichrome are possible if available on the semiconductor process used. Although process variations cause the exact value of the internal resistance to vary, the value is also nominally set at 800 ohms. In addition to the reference resistances $R_{EXT}$ and $R_{INT}$, resistance block 70 includes two electrostatic discharge (ESD) protection resistors R3 and R4. The purpose of the ESD resistance R3 is to protect the integrated circuit from damage due to a high-voltage electrostatic discharge at the external bonding pad 12. The exact value of R3 is chosen to produce the desired ESD protection, while maintaining an acceptable voltage drop during normal operation. Electrostatic discharge resistor R4 is also an ESD resistor, whose value is chosen to provide the desired level of ESD protection, but its exact value need not match that of resistor R3. Resistor R4 also provides an alternative voltage sensing path coupled directly to the output pad 12. Note that resistances R3 and R4 can contain parasitic resistance elements as well.

In resistance block 70 FET switches are used to select the resistances and configure the operational modes. There are five FET switches, M1-M5. Each switch passes current from a first current node (source or drain of the FET) to a second current node (drain or source of the FET) or blocks the current in response to a control signal received at the gate of the FET. FET switches M1 and M2 are single N-channel FETs. Current is passed when the gate is coupled to a logic one (typically five volts), and current is blocked when the gate is coupled to a logic zero (typically zero volts). FET switches M3-M5 are parallel combinations of an N-channel FET (M3N, M4N, and M5N) and a P-channel FET (M3P, M4P, and M5P), the two FETs are coupled in parallel to minimize the voltage drop across the FETs across the entire voltage operating range. Current is passed when the gate of the N-channel FET is coupled to a logic one and the gate of the P-channel FET is coupled to a logic zero. Current is blocked when the gate of the N-channel FET is coupled to a logic zero and the gate of the P-channel FET is coupled to a logic one.

Two pairs of FET switches are mutually exclusive in resistance block 70. FET switch M2, whose gate is driven by logic signal RSEL0, is mutually exclusive of FET switch M1, whose gate is driven by the inverse RSEL0 logic signal through inverter 52. This allows the reference current $I_{REF}$ to pass from reference current node 44 through one and only one of the FET switches M1 or M2. Similarly, FET switches M4 and M5 are mutually exclusive. Logic signal RSELO drives the gate of the P-channel FET of switch M5 and also the gate of the N-channel FET of switch M4, while the inverted RSELO logic signal drives the gate of N-channel FET of switch M5 and the gate of P-channel FET of switch M4. FET switch M3 is not mutually exclusive with any other switch, and is enabled only when the digital input signal RSEL1 is at a logic one.

Digital input signal RSELO is connected to the gates of M2, M5P, and M4N, as well as the input of inverter 52 at circuit node 42. The output of inverter 52 is coupled to the gates of FET switches M1, M5N, and M4P. Digital input signal RSEL1 is connected solely to the gate of FET switch M3N and the input of inverter 56. The output of inverter 56 is coupled to the gate of FET switch M3P.

The reference current node 44 is coupled to the sources of both FET switches M1 and M2. The output of FET switch M2 is coupled to one end of ESD resistance R3. The other end of the ESD resistance R3 is coupled directly to the integrated circuit pad 12. Pad 12 is also coupled to the external reference resistance $R_{EXT}$. The other end of $R_{EXT}$ is coupled to an appropriate reference voltage or ground. The output of FET switch M1 is coupled to the internal reference resistance $R_{INT}$. It can be seen that the reference current flowing into node 44 can pass either through FET switch M2 through the external resistance $R_{EXT}$ to ground, or through FET switch M1 through the internal resistance $R_{INT}$ to ground.

The reference voltage sensing node 48 is coupled to the first current node of FET switches M5 and M4. The second current node of FET switch M5 is coupled to the internal resistance $R_{INT}$. The second current node of FET switch M4 is coupled to one end of the ESD resistance R4 at node 66. Therefore, when FET switch M5 is enabled, the voltage on the internal resistance RINT is coupled to node 48, and when FET switch M4 is enabled, the voltage on the external resistance is coupled to node 48. FET switch M3 is coupled between the internal reference resistance and the ESD resistance R3 at node 62. When FET switch M3 is enabled, the voltage at the internal resistance $R_{INT}$ is coupled onto external pad 12.

Reference block 70 can be placed into one of four modes of operation. The operational mode is selected by four possible combinations on the digital control signals RSEL1 and RSELO. There are three operational modes. A first mode selects the internal resistor, $R_{INT}$. A second mode selects the external resistor, $R_{EXT}$. A third mode selects the internal resistor and couples it to the external pad 12 for testing the accuracy of the internal resistor. The fourth mode is not recommended. The mode name and number and the corresponding encoding of the control signals is shown below in Table 1.

TABLE 1

| MODE # | RSEL1 | RSEL0 | MODE NAME |
|---|---|---|---|
| 0 | 0 | 0 | Internal mode |
| 1 | 0 | 1 | External precision mode |
| 2 | 1 | 0 | Internal mode w/external connection |
| 3 | 1 | 1 | Not used |

Figure 6:
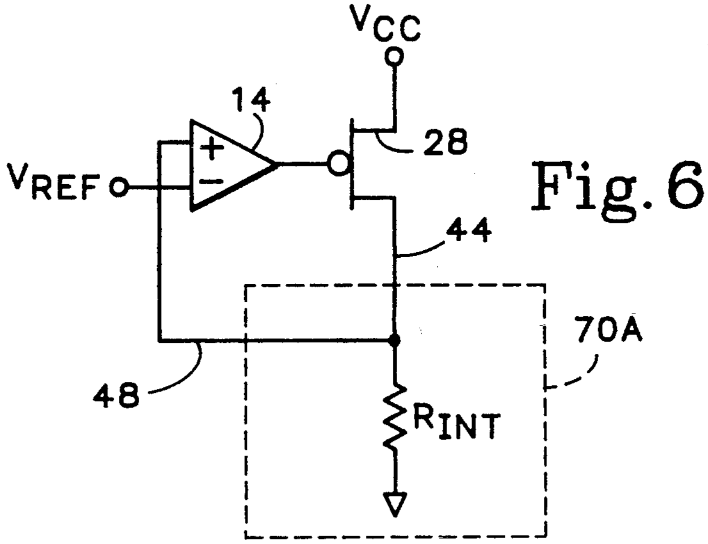
FIGS. 6-8 are equivalent schematic diagrams of the reference generator circuit in each of the operational modes.

The internal mode, Mode 0, is entered into when, as shown in Table 1, logic signals RSELO and RSEL1 are both at a logic zero level. FET switches M1 and M5 are enabled while FET switches M2–M4 are disabled. A simplified equivalent schematic is shown in FIG. 6, in which the enabled FET switches are replaced by short circuits, and the disabled FET switches are replaced by open circuits. Driving circuitry is also omitted. An equivalent reference resistance block 70A is shown in a exemplary configuration with the op-amp 14 and the P-channel FET 28, which produces the reference current $I_{REF}$. Resistance block 70A, therefore, is the internal resistor, $R_{INT}$, coupled to current node 44 and reference voltage node 48 as shown.

Figure 7:
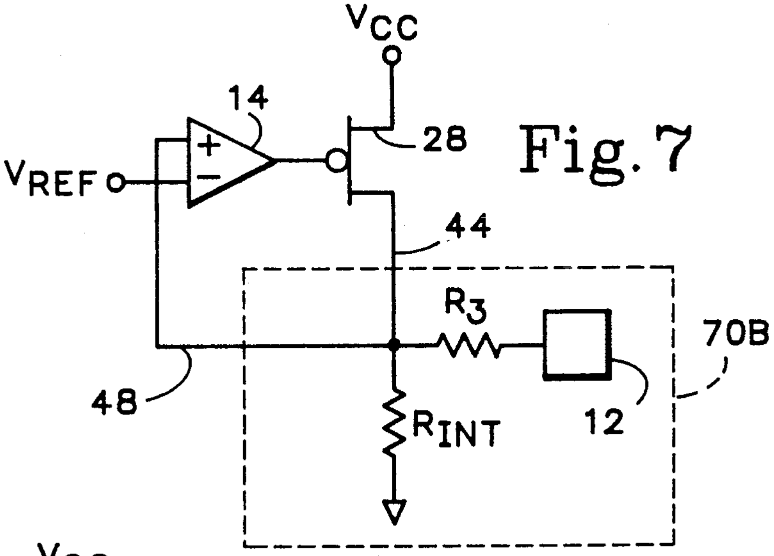

Referring now to FIG. 7, Mode 2 operates with the internal resistance and establishes a connection to external pad 12 through sensing resistor R3 for test or debug purposes. The equivalent schematic of resistance block 70B is shown in the same exemplary schematic as in FIG. 6, using the same assumptions. Mode 2 is entered into when, as shown in Table 1, control signal RSEL1 is at a high level and control signal RSELO is at a low level. This mode is functionally identical to Mode 0 with the exception that switch M3 is enabled in Mode 2 and not enabled in Mode 0. With control signal RSEL1 at the logic high level, switch M3 is enabled, allowing the node voltage on the internal resistance $R_{INT}$ to be coupled to integrated circuit pad 12 through resistor R3. In operation, the voltage at pad 12 can be measured by the circuit tester to determine the accuracy of the internal resistance. Once the internal resistance is known the circuits can be sorted or "binned" according to whether they fall within the acceptable tolerance, for example, ±1-5%, or other desired tolerance range.

Figure 8:
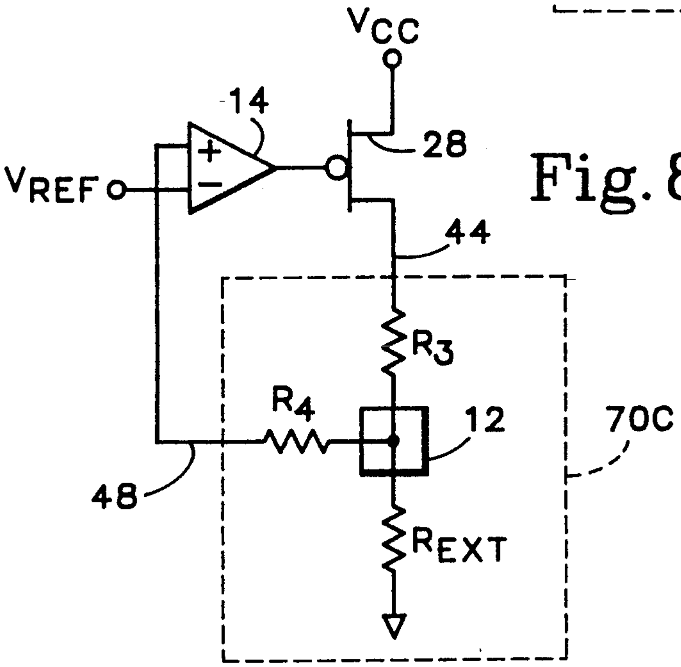

Referring now to FIG. 8, the precision external mode, Mode 1, is entered into when control signal RSELO is at a high level and control signal RSEL1 is at a low level. With the signal RSELO at the logic high level, switches M2 and M4 are enabled and switches M1 and M5 are disabled. Driving RSELO to the logic high level causes the gates of N-channel switches M2 and M4 to be high, thereby enabling them, while causing the gate of P-channel switch M5 also to be high, thereby disabling it. The output of the inverter 52 drives the logic low level onto the gates of N-channel switches M1 and M5N, thereby disabling them, and driving a logic low level onto the gate of P-channel switch M4P, thereby enabling it. Driving RSEL1 to a logic low level drives a logic low level onto the gate of N-channel of M3N and therefore a logic high level through inverter 56 onto the gate of the P-channel switch M3P, thereby disabling switch M3. The resulting equivalent schematic of resistance block 70C and the exemplary current generation circuit is shown in FIG. 8.

The resulting equivalent schematic of resistance block 70C demonstrates one of the primary advantages of the invention: accurate resistance value sensing, which enables an extremely accurate reference current to be generated. By replicating the ESD resistance R3 in R4, the integrated circuit embodying the generator circuit is able to maintain the desired level of ESD protection, while ensuring that the exact node voltage at the reference resistance is fed back to the current generator. Because of the high-impedance of the input of the op-amp 14 there is no appreciable current that flows through resistance R4, and therefore no appreciable voltage drop develops across R3. This allows the exact node voltage at the IC pad 12 to be sensed and fed back to the op-amp. While resistances R3 and R4 are equal in the preferred embodiment, any value can be used. The value of R3 is normally a sufficient value to maintain proper ESD protection, since it is coupled to external bonding pad 12.

Having described and illustrated the principles of the invention in a preferred embodiment thereof, it is apparent to those skilled in the art that the invention can be modified in arrangement and detail without departing from such principles. I therefore claim all modifications and variation coming within the spirit and scope of the following claims.

I claim:

1. A resistance circuit block for use in an integrated circuit reference current generator comprising:

a current node through which a current from a voltage-controlled current source is supplied;

a voltage sensing node for supplying voltage feedback to the voltage-controlled current source;

an external bonding pad for coupling to an external current-setting resistor;

a first electrostatic protection resistor coupled between the current node and the external bonding pad; and a second electrostatic protection resistor coupled between the voltage sensing node and the external bonding pad.

2. A resistance circuit block according to claim 1 further comprising switch means for coupling the current node and the voltage sensing node to an internal resistor in a first operational mode and for coupling the current node and the voltage sensing node to the external bonding pad through the first and second protection resistors, respectively, in a second operational mode.

3. A resistance circuit block according to claim 2 in which the switch means comprises:

a first switch coupled between the current node and the internal resistor;

a second switch coupled between the current node and a first end of the first electrostatic resistor not coupled to the bond pad;

a third switch coupled between the voltage sensing node and a first end of the second electrostatic protection resistor not coupled to the bond pad; and a fourth switch coupled between the voltage sensing node and the internal current-setting resistor.

4. A resistance circuit block according to claim 3 in which the switch means further comprises means for coupling the voltage on the internal resistor to the external bonding pad in a third operational mode.

5. A resistance block according to claim 4 in which the coupling means comprises a fifth switch coupled between the internal current-setting resistor and a first end of the first electrostatic resistor not coupled to the bond pad.

6. A resistance bock according to claim 4 in which the switch means further comprises control means for receiving first and second control signals for placing the resistance blocks in one of the first, second, and third control modes.

7. A method for generating a precision current in an integrated circuit having first and second electrostatic resistors coupled to a bond pad, the method comprising the steps of:

coupling a precision current-setting resistor to the bond pad;

generating a current through the first electrostatic protection resistor;

sensing the voltage at the bond pad through the second electrostatic protection resistor such that the current flow therethrough is substantially equal to zero, and all of the current flowing through the first electrostatic protection resistor substantially flows through the precision current-setting resistor; and adjusting the value of the current in the current-setting resistor to be equal to a predetermined reference current in response to the sensed voltage.

* * * * *